(12) United States Patent
Kuo

(10) Patent No.: US 8,981,273 B2
(45) Date of Patent: Mar. 17, 2015

(54) OPTICAL FREQUENCY TRACKING AND STABILIZATION BASED ON EXTRA-CAVITY FREQUENCY

(71) Applicant: RAM Photonics, LLC, San Diego, CA (US)

(72) Inventor: Ping Piu Kuo, San Diego, CA (US)

(73) Assignee: RAM Photonics, LLC, San Diego, CA (US)

( * ) Notice: Subject to any disclaimer, the term of this patent is extended or adjusted under 35 U.S.C. 154(b) by 269 days.

(21) Appl. No.: 13/725,563

(22) Filed: Dec. 21, 2012

(65) Prior Publication Data

US 2014/0070072 A1    Mar. 13, 2014

Related U.S. Application Data

(60) Provisional application No. 61/700,813, filed on Sep. 13, 2012.

(51) Int. Cl.
G01J 3/02    (2006.01)
G01J 1/16    (2006.01)
G01J 9/04    (2006.01)
H01S 5/0687  (2006.01)
H01S 5/40    (2006.01)

(52) U.S. Cl.
CPC .... G01J 3/02 (2013.01); G01J 1/16 (2013.01); G01J 9/04 (2013.01); H01S 5/0687 (2013.01); H01S 5/4087 (2013.01)
USPC ........................................ 250/205; 250/201.1

(58) Field of Classification Search
USPC .............................................. 250/205, 201.1
See application file for complete search history.

(56) References Cited

U.S. PATENT DOCUMENTS

2010/0265972 A1* 10/2010 Hartl et al. ................. 372/18
2014/0161464 A1*  6/2014 Bowers et al. .............. 398/115

* cited by examiner

*Primary Examiner* — Tony Ko
(74) *Attorney, Agent, or Firm* — Kilpatrick Townsend & Stockton LLP

(57) ABSTRACT

Embodiments of the invention provides methods and systems for synthesizing optical signals with high frequency stability. Using a set of external optical signal manipulators and control systems, embodiments of the invention enhance the resolution of any frequency reference and thereby alleviates the needs for ultra-high-Q cavities in frequency-stable optical signal synthesis. The invention consequently improves the performance of any optical signal generator by a substantial margin, while maintaining the system complexity and power dissipation at levels comparable to the original systems.

24 Claims, 10 Drawing Sheets

OPTICAL FREQUENCY TRACKING AND STABILIZATION BASED ON EXTRA-CAVITY FREQUENCY

CROSS-REFERENCES TO RELATED APPLICATIONS

This application claims priority to U.S. Provisional Patent Application No. 61/700,813, filed on Sep. 13, 2012, entitled "Optical Frequency Tracking and Stabilization Based on External-Cavity Frequency," the disclosure of which is hereby incorporated by reference in its entirety for all purposes.

BACKGROUND OF THE INVENTION

In analogy to signal synthesis in the electrical domain, optical signal synthesis technology involves systems and methods for generating optical signals with deterministic frequency and amplitude characteristics. Synthesizing optical signals with a high frequency precision and signal-to-noise ratio (SNR) has enabled numerous novel applications in communications, sensing and metrology. In one example, low-noise optical oscillators have allowed existing optical transmission links to attain orders-of-magnitude higher transmission capacity by supporting high-rate coherent signal transmission. In another example, characteristics of multiple chemical species are revealed with unprecedented sensitivity and precision by employing frequency-stabilized optical laser sources for spectroscopic interrogation.

Despite the progress made in optical signal synthesis, there is a need in the art for fiber-based amplifiers with repeatable output pulse characteristics independent of the pulse repetition frequency.

SUMMARY OF THE INVENTION

Embodiments of the present invention relate to systems and methods for optical frequency synthesis and stabilization, and more specifically to a novel high-resolution instantaneous frequency acquisition and feed-back control system.

Embodiments described herein provide systems for creating optical signals carrying amplified replicas of the frequency drift of the input optical or electrical oscillators as well as methods of using these optical signal to stabilize the frequency of the optical or electrical oscillators. The present invention alleviates the need for high-Q cavities in synthesizing frequency-stable and high-optical signal to noise ratio (OSNR) optical signals in optical frequency-comb systems.

According to an embodiment of the present invention, a system is provided. The system includes an input optical signal source operable to generate a first optical wave and a second optical wave characterized by a first center frequency and a second center frequency, respectively. The first center frequency and the second center frequency are separated by a frequency spacing. The system also includes an optical frequency mixer coupled to the input optical signal source and operable to input the first optical wave and the second optical wave to generate a plurality of third optical waves characterized by respective third center frequencies separated from each other by the frequency spacing. At least one third center frequency is different from the first center frequency and the second center frequency. The system further comprises a spectral filter coupled to the optical frequency mixer and operable to transmit one of the plurality of third optical waves. The transmitted third optical wave is characterized by a selected third center frequency that is different from the first center frequency and the second center frequency. Additionally, the system includes an optical frequency reference coupled to the spectral filter and operable to generate an output optical signal characterized by an amplitude that is proportional to a frequency difference between a reference frequency and the selected third center frequency, a photodetector coupled to the optical frequency reference and operable to convert the output optical signal to an electrical signal, and a feedback controller coupled to the photodetector and the input optical signal source. The feedback controller is operable to convert the electrical signal into a frequency-tuning signal and to apply the frequency-tuning signal to the input optical signal source to adjust the second center frequency thereby stabilizing the second center frequency.

According to another embodiment of the present invention, a method is provided. The method includes providing, using an input optical signal source, a first optical wave and a second optical wave characterized by a first center frequency and a second center frequency, respectively. The first center frequency and the second center frequency are separated by a frequency spacing. The method also includes mixing, via a nonlinear optical medium, the first optical wave and the second optical wave to provide an output wave comprising a plurality of third optical waves characterized by respective third center frequencies separated from each other by the frequency spacing. At least one third center frequency is different from the first center frequency and the second center frequency. The method further includes spectrally filtering the output wave to transmit one of the plurality of third optical waves. The transmitted third optical wave is characterized by a selected third center frequency that is different from the first center frequency and the second center frequency. Additionally, the method includes inputting the transmitted third optical wave into an optical frequency reference to generate an output optical signal characterized by an amplitude that is proportional to a frequency difference between a reference frequency and the selected third center frequency, converting the output optical signal to an electrical signal, converting the electrical signal to a frequency-tuning signal, and applying the frequency-tuning signal to the input optical signal source to adjust the second center frequency, thereby stabilizing the second center frequency.

According to an embodiment of the present invention, a method of creating optical signals that carry amplified replicas of the instantaneous frequency drift found in optical or electrical oscillators is provided. In one embodiment of the invention, a plurality of optical signals are generated by two single-frequency laser sources with distinct frequencies and are combined to form a single optical signal. The optical signal subsequently undergoes nonlinear interaction within at least one nonlinear optical medium to generate an optical frequency-comb signal, which contains a number of frequency components greater than the number of frequency components at the input of the nonlinear medium. Any of the new frequency tones created in the nonlinear medium contains the amplified frequency drift of the input laser sources.

According to another embodiment of the present invention, an optical signal is generated by at least one single-frequency laser source and is launched into at least one electro-optical modulator (EOM). The EOM (or the set of EOMs) is driven by an electrical signal source and converts the input optical signal into an optical frequency-comb in which the number of frequency components contained therein is greater than the number of frequency components contained in the optical signal at the input of the EOM. The optical frequency-comb signal may propagate through one or multiple nonlinear optical media to further increase the number of frequency components.

According to yet another embodiment of the present invention, an optical signal is generated by one single-frequency laser source and is launched into at least one EOM. The EOM (or the set of EOMs) is driven by an electrical signal source, which converts the input optical signal into an optical frequency comb. A set of optical filters then separates the frequency comb into at least two optical signals, each contains at least one frequency tone. The optical signals are received by individual optical circulators, wherein the optical signal is directed to a laser to perform injection locking. The optical signals created by the injection-locked lasers are subsequently combined and undergo nonlinear interaction within a nonlinear medium, wherein new optical frequency tones are created.

In another embodiment of the present invention, an optical signal is generated by a mode-locked laser source and subsequently undergoes nonlinear interaction within at least one nonlinear optical medium. The number of frequency components of the optical signal at the output of the nonlinear optical medium is greater than the number of frequency components of the optical signal generated by the mode-locked laser source.

In another aspect of the present invention, the amplification of frequency-drift carried by a newly-created frequency component is harnessed to enhance the sensitivity of an optical frequency stabilization system, thereby improving the frequency stability as well as the OSNR of the optical frequency-comb generated therein. In one embodiment, at least two frequency components are extracted from the optical signal generated in the nonlinear optical medium and/or the EOM using a set of optical filters, and subsequently received by an optical frequency reference to convert the frequency drift into the corresponding intensity fluctuations. The optical frequency reference may be an optically-transparent enclosure containing at least one chemical species, whereof the absorption lines are aligned with the frequencies of the received optical signals. Alternatively, the optical frequency reference may be an optical resonant cavity, wherein the received optical signals can resonate. A set of photodetectors receives the transmitted and/or reflected optical signals from the optical frequency reference and the photocurrents generated are received by a controller. Subsequently, the controller generates frequency control signals that feed the frequency control mechanisms in the input optical and/or electrical signal generators, thereby stabilizing the frequency of the recipient.

In yet another aspect of the present invention, the strict frequency relationships between a newly-created frequency component and the input optical signals are utilized to enable frequency tuning of the input optical signals at a resolution finer than that allowed by the resolution of the optical frequency reference incorporated.

In a further aspect of the present invention, the optical signal-to-noise ratio of an optical frequency comb is improved by the pan-spectral frequency stabilization enabled by the invention.

In one embodiment, an optical frequency stabilization system comprises: (a) an input optical signal source operable to provide at least two frequency tones. The optical frequency tones are equidistance in frequency. The system also includes (b) an optical frequency mixer operable to create new frequency tones not contained in the input optical signal, (c) a bandpass filter, and (d) an optical frequency reference. The frequency offset of the selected optical signal relative to the spectral feature of the reference is converted to the amplitude of the output optical signal. The system further includes (e) photodetectors, wherein the output optical signal from the optical frequency reference is converted to an electrical signal, and (f) a feed-back controller, wherein the output electrical signal from the photodetector is converted to another electrical signal.

In one embodiment, the two optical signals are generated by two independent laser sources. The optical signals generated by the laser sources are combined into single optical signal to form the input optical signal.

In one embodiment, an optical signal is generated by a combination of an electro-optical modulator and a single-frequency laser source. The optical carrier of the laser source is modulated in an electro-optical modulator driven by an electrical signal generator and split into at least two distinct frequency tones to form the input optical signal.

In one embodiment, an optical signal is generated by a combination of an electro-optical modulator and single-frequency laser source. The optical signal generated by the laser source is modulated in an electro-optical modulator driven by an electrical signal generator to form an optical frequency comb. At least two frequency tones in the optical frequency comb are extracted and separated into individual optical signals using an optical filtering element. Each of the extracted optical signals is launched into a distinct laser source, wherein the laser source output is phase-locked to the supplied optical signal by means of injection locking. The output optical signals from the phase-locked laser sources are combined to form the input signal.

In one embodiment, an optical signal is generated by a passive mode-locked laser. The optical signal generated by the passive mode-locked laser forms the input optical signals.

In one embodiment, an optical signal is generated by an active mode-locked laser. The optical signal generated by the active mode-locked laser forms the input optical signals.

In one embodiment, the mixer contains at least one segment of optical medium providing a third-order nonlinear optical response.

In one embodiment, the mixer contains at least one segment of optical medium providing a second-order nonlinear optical response.

In one embodiment, the optical reference contains at least one optical cavity resonator.

In one embodiment, the optical reference contains at least one optical diffraction grating.

In another embodiment, the optical reference contains at least one grating structure inscribed in an optical waveguide.

In one embodiment, the optical signal input to the optical frequency reference is formed by an absorptive or transmissive response of at least one chemical species.

In one embodiment, the bandwidth of the absorption or transmission lines in proximity to the frequency of the optical signal input to the optical frequency reference is equal to or less than approximately 10 Gigahertz.

In one embodiment, the optical signal input to the optical frequency reference is combined with a reference optical signal.

In one embodiment, the linewidths of the input optical signals are less than or equal to 20 megahertz, defined as the full-width at half-maximum of a spectral line in the self-heterodyne signal with a 1-microsecond delay.

In one embodiment, the feedback controller contains at least one proportional gain path or derivative gain path or integral gain path, or any combination of proportional, derivative and integral gain paths.

In one embodiment, the feedback controller contains a gain path for which the temporal response is matched to the broadening mechanism of the input signal laser source.

In another embodiment, a method of operating an optical frequency stabilization system comprises: (a) forming an input optical signal by combining a first optical signal and a second optical signal, with the frequencies of the first and second optical signals being distinct, (b) transmitting an input optical signal across the optical frequency mixer, wherein a plurality of new optical frequency tones are generated due to the nonlinear optical response in the optical frequency mixer, (c) transmitting the optical signal from the optical frequency mixer through one or more optical filtering elements, wherein new optical frequency tones are extracted to form a frequency-lock optical signal, (d) transmitting the frequency-lock optical signal across an optical frequency reference, wherein the frequency position of the frequency-lock signal is converted to a corresponding amplitude change of the frequency-lock signal, (e) receiving the output optical signal of the optical frequency reference in a photodetector, wherein the measured optical power is converted to a corresponding electrical signal, (f) processing the electrical signal from the photodetector in a feedback controller, wherein an electrical frequency-tuning signal is provided by an electronic system according to the electrical signal generated by the photodetector, and (g) adjusting the frequency of the second optical signal according to the frequency-tuning signal, thereby stabilizing the frequency of the second optical signal.

In a specific embodiment, a method of operating an optical frequency stabilization system comprises: (a) forming an input optical signal by modulating an optical signal from a laser with an electro-optical modulator driven by an electrical signal generator, (b) transmitting an input optical signal across the optical frequency mixer, wherein a plurality of new optical frequency tones are generated due to the nonlinear optical response in the optical frequency mixer, (c) transmitting the optical signal from the optical frequency mixer through optical filtering elements, wherein a new optical frequency tone is extracted to form a frequency-lock optical signal, (d) transmitting the frequency-lock optical signal across an optical frequency reference, wherein the frequency motion of the frequency-lock signal is converted to a corresponding amplitude change of the frequency-lock signal, (e) receiving the output optical signal of the optical frequency reference in a photodetector, wherein the measured optical power is converted to a corresponding electrical signal, (f) processing the electrical signal from the photodetector in a feedback controller, wherein an electrical frequency-tuning signal is provided by an electronic system according to the electrical signal generated by the photodetector, and (g) adjusting the frequency of the electrical signal generator driving the electro-optical modulator, thereby stabilizing the frequency of the electrical signal generator.

In another specific embodiment, a method of operating an optical frequency stabilization system comprises: (a) forming an input optical signal by combining a first optical signal generated by injection locking a laser to a first frequency, and a second optical signals generated by injection locking a laser to a second frequency, wherein the first and second frequencies are distinct, (b) transmitting an input optical signal across the optical frequency mixer, wherein a plurality of new optical frequency tones are generated due to the nonlinear optical response in the optical frequency mixer, (c) transmitting the optical signal from the optical frequency mixer across one or more optical filtering elements, wherein a new optical frequency tone is extracted to form a frequency-lock optical signal, (d) transmitting the frequency-lock optical signal across an optical frequency reference, wherein the frequency motion of the frequency-lock signal is converted to a corresponding amplitude change of the frequency-lock signal, (e) receiving the output optical signal of the optical frequency reference in an photodetector, wherein the measured optical power is converted to a corresponding electrical signal, (f) processing the electrical signal from the photodetector in a feedback controller, wherein an electrical frequency-tuning signal is provided by an electronic system according to the electrical signal generated by the photodetector, and (g) adjusting the frequency of the first optical signal generated according to the frequency-tuning signal, thereby stabilizing the frequency of the first optical signal.

Numerous benefits are achieved by way of the present invention over conventional techniques. For example, embodiments of the present invention reduce the residual frequency noise in stabilized optical and/or electrical frequency sources. Some embodiments provide spectral linewidth reduction. Additionally, embodiments of the present invention improve the signal to noise ratio of optical frequency comb sources. Embodiments of the present invention also enhance the frequency tenability of frequency-stabilized optical sources. As described herein, various embodiments provide practical advantages in multitude applications. For example, the invention improves the sensitivity and operating wavelength range of optical spectroscopy apparatus. As another example, the invention increases the link budget of coherent optical communication systems by reducing the phase noise and amplitude noise of the transmitter sources and local oscillators. These and other embodiments of the invention along with many of its advantages and features are described in more detail in conjunction with the text below and attached figures.

DETAILED DESCRIPTION OF THE INVENTION

Figure 1:
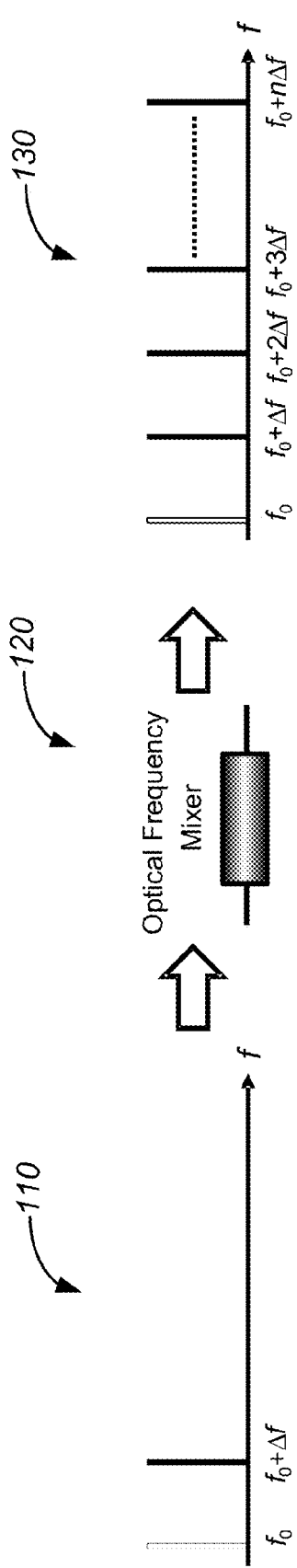
FIG. 1 illustrates the generation of an optical frequency comb in an optical frequency mixer, according to an embodiment of the invention.

Embodiments of the invention provide methods and systems for synthesizing optical signals with the frequency stability better than the level allowed by the optical cavities incorporated in the optical signal generators. Using a set of external optical signal manipulators and control systems, the invention enhances the resolution of any frequency reference and thereby alleviates the needs for ultra-high-Q cavities in frequency-stable optical signal synthesis. The invention consequently improves the performance of any optical signal generator by a substantial margin, while maintaining the system complexity and power dissipation at levels comparable to the original systems.

While conventional applications are primarily fulfilled by single-frequency optical signals, emerging applications are demanding a new form of optical radiation that possesses multiple phase-locked frequency tones, namely optical frequency combs. The instantaneous frequencies of the component tones in an optical frequency comb is defined by their frequency spacing $\Delta f$ and the carrier-envelope offset frequency $\Delta_{CEO}$. Consequently, the frequency precision of an individual frequency tone in an optical frequency comb signal is directly related to the stability of the $\Delta f$ and $f_{CEO}$. Optical frequency combs with highly-stable frequency spacing and carrier-envelope offset frequency have enabled a number of new explorations. For instance, certain characteristics of a chemical species can be known with orders-of-magnitude higher precision by measuring the transition frequency of the energetically-excited species in the optical domain. In another example, the utility of frequency-stable optical frequency combs reduces the system complexity of an optical communication link yet simultaneously attains higher performance.

Optical signal generation couples with a certain form of an optically resonant cavity in order to accumulate an optical signal in a coherent manner, thereby defining the signal's frequency and amplitude characteristics. The frequency and amplitude stability of the generated optical signal are primarily determined by the quality of the optical cavity, measured in terms of a Q-factor. A higher Q-factor cavity possesses a finer resonance signature in the frequency domain, which leads to a smaller amount of frequency drift in the generated optical signal. Simultaneously, the narrow spectral pass-band of a high Q-factor cavity provides better rejection to the non-resonant portion of the optical signal, thereby resulting in lower amplitude fluctuations in the generated optical signal due to interference between the resonant and non-resonant (i.e., noise) components.

Although contemporary art in optical surface processing and materials engineering allows one to construct a cavity with an extremely high Q-factor, the quality and characteristics of a high-Q cavity in terms of frequency resolution, spacing and spectral positions of the cavity's resonant modes are seldom repeatable in manufactured devices, consequently, rendering mass-production with guaranteed performance difficult if not unrealistic. Furthermore, the resonance frequency of a high-Q cavity is inherently susceptible to drift due to mechanical and/or thermal perturbation. Consequently, operating with a high-Q cavity typically requires a sophisticated environmental isolation platform in order to attain the desired performance. The complication associated with the complexity of environmental isolation becomes oppressive in scenarios in which a sizable number of high-quality optical signals are needed—stabilizing a large number of optical cavities not only requires substantial excess real estate, but also drives the power consumption and thermal dissipation to an unmanageable level.

In one embodiment of the present invention, an optical frequency stabilization system is provided, which enables frequency stabilization as well as tracking to a precision not permitted by conventional means. FIG. 1 illustrates the generation of an optical frequency comb in an optical frequency mixer, according to an embodiment of the invention. In the simplified system depicted in FIG. 1, the input to the system involves an optical signal 110 containing two distinct frequency tones, each generated by a separate laser. The frequency of the first frequency tone is denoted as $f_0$ whereas the second frequency tone is separated from the first tone by a frequency offset $\Delta f$, thereby occupying the frequency $f_1 = f_0 + \Delta f$. Upon propagation in the optical frequency mixer 120 comprising a combination of nonlinear optical media, the nonlinear optical interaction between the first and second frequency tones generates an optical frequency comb 130 containing a plurality of new frequency tones. The frequencies of the new tones follow the relationship below, owing to the law of conservation of energy in the nonlinear optical process:

$$f_n = f_0 + n \times \Delta f \qquad (1)$$

where the index n indicates the spectral position relative to the first frequency tone, which is also known as the order of the tone. In the presence of frequency drift in the first and second frequency tones, the frequency of the new tones will inherit the drift carried by the input tones. The frequency relationship conveyed in Eq. (1) is subsequently modified as follow:

$$(f_0+\delta_0)+n\times[(f_1+\delta_1)-(f_0+\delta_0)]=f_0+n\times\Delta f+[n\times(\delta_1-\delta_0)+\delta_0]=f_n+\delta_n \qquad (2)$$

where $\delta_0$ and $\delta_1$ are the instantaneous frequency deviation of the first and second frequency tones, respectively. The relationship in Eq. (2) demonstrates an important property in regards to the frequency characteristics of a new tone—the frequency drift of the new tone is an amplified replica of the deviations introduced by the first and second tones.

The present invention subsequently harnesses the frequency-drift amplification effect to enhance the resolution of any existing frequency measurement system, thereby improving the accuracy of frequency locking. In one example, the first optical signal is supplied by a fixed-frequency laser source, whereas the second optical signal is generated by a tunable laser source. The tunable laser source, owing to the environmental perturbation to the reconfigurable optical cavity incorporated therein, generates the second optical signal, which exhibits an appreciable amount of frequency drift. In contrast, the non-tunable optical cavity in the fixed-frequency laser source is inherently less sensitive to external perturbation, thus inferring that the extent of frequency drift conveyed by the first optical signal ($\delta_0$) is substantially lower than that of the second optical signal ($\delta_1$).

Figure 2:
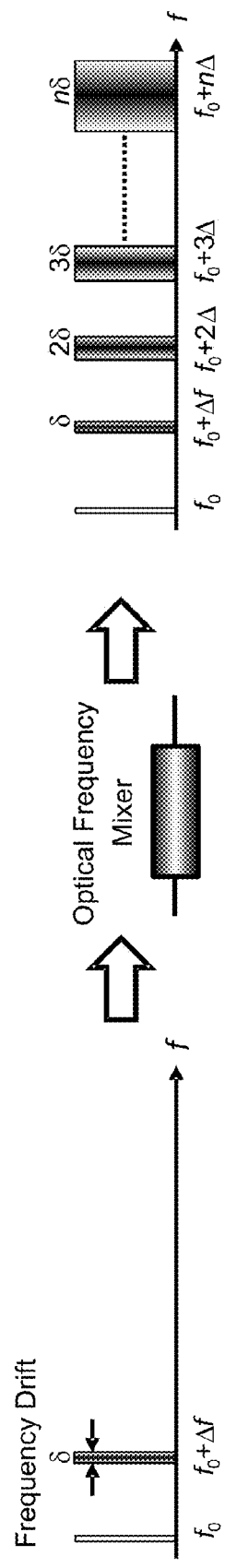
FIG. 2 illustrates the frequency-drift scaling phenomenon in an optical frequency comb generation process, according to an embodiment of the invention.

FIG. 2 illustrates the frequency-drift scaling phenomenon in an optical frequency comb generation process, according to an embodiment of the invention. The frequency deviations carried by the new frequency tones is therefore dominated by the contribution from the second optical signal, as illustrated in FIG. 2:

$$\delta_n = n \times (\delta_1 - \delta_0) + \delta_0 \approx n \times \delta_1 \quad (3)$$

Consequently, the amplified frequency deviation carried by the new frequency tones provides an improvement to the measurement of the frequency drift of the tunable laser source, overcoming the classical limit due to the detection noise and/or the ambiguity in the optical frequency reference.

Figures 3A, 3B:
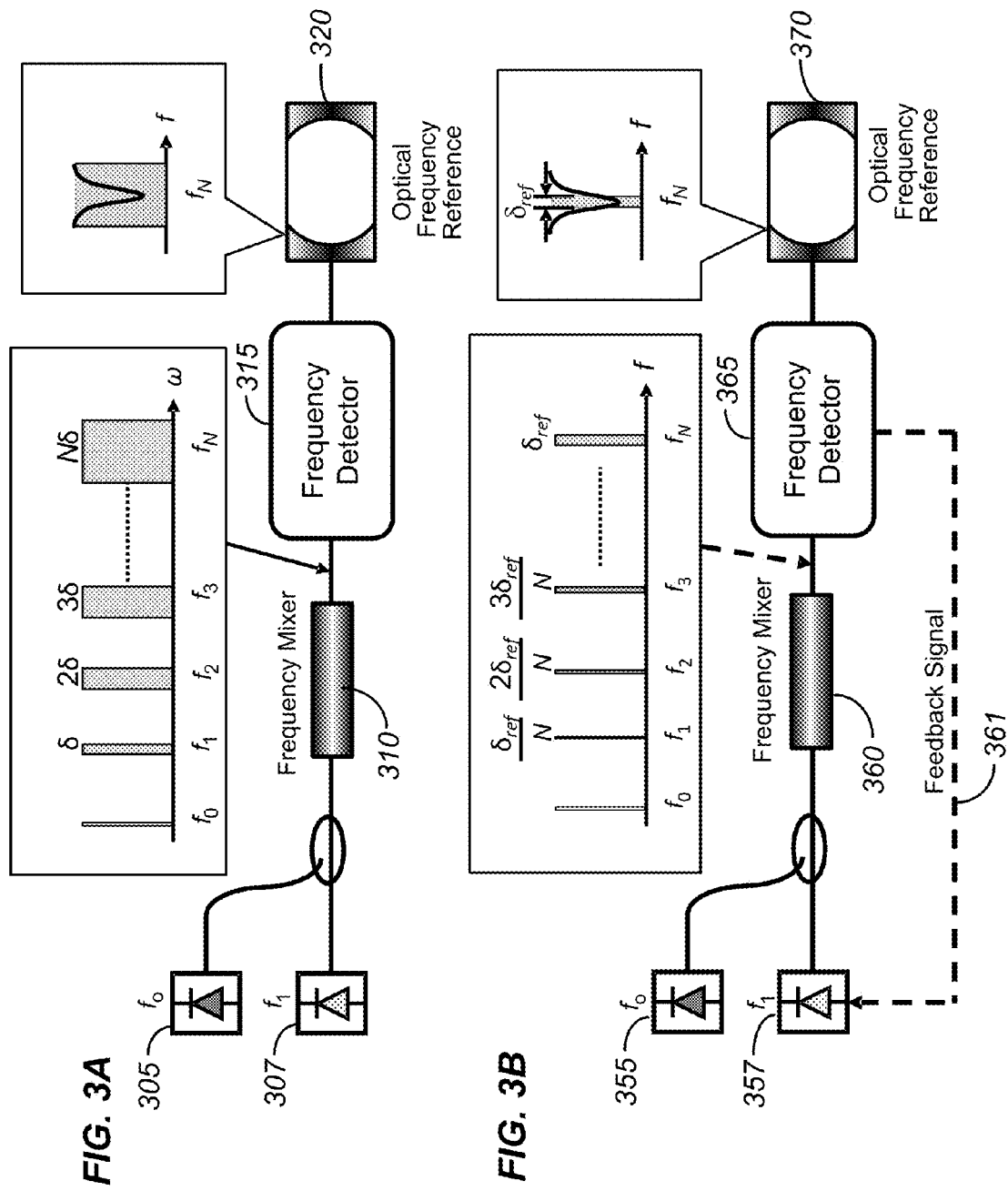
FIG. 3A illustrates an optical frequency stabilization system that incorporates an optical frequency mixer according to an embodiment of the invention.
FIG. 3B illustrates an optical frequency stabilization system that incorporates an optical frequency mixer and a feedback signal according to an embodiment of the present invention.

FIG. 3A illustrates an optical frequency stabilization system that incorporates an optical frequency mixer according to an embodiment of the invention. Referring to FIG. 3A, the $N^{th}$-order tone generated in an optical frequency mixer 310 fed by a first optical source 305 and a second optical source 307 is extracted in the frequency detector 315, and subsequently received by the optical frequency reference 320. In an embodiment, the first optical source 305 and the second optical source 307 form an input optical signal source that is operable to generate a first optical wave and a second optical wave characterized by a first center frequency ($f_0$ associated with the first optical source) and a second center frequency ($f_1$ associated with the second optical source), respectively. The first center frequency and the second center frequency are separated by a frequency spacing ($f_1 - f_0$).

The system also includes an optical frequency mixer 310 coupled to the input optical signal source and operable to input the first optical wave and the second optical wave to generate a plurality of third optical waves characterized by respective third center frequencies separated from each other by the frequency spacing. At least one third center frequency is different from the first center frequency and the second center frequency. The optical frequency mixer is also utilized in other embodiments of the present invention.

FIG. 3B illustrates an optical frequency stabilization system that incorporates an optical frequency mixer 360 and a feedback signal according to an embodiment of the present invention. Referring to FIG. 3B, the frequency detector 365 converts the frequency drift of the $N^{th}$-order tone relative to the spectral feature of the optical frequency reference 370, and produces a feedback signal 361 that controls the instantaneous frequency of the second optical source 357 ($f_1$). The frequency ambiguity ($\delta_{ref}$) of the frequency reference 370 is reduced to $\delta_{ref}/N$ in the frequency of the stabilized second optical source 357, when the first optical source 355 carries an insignificant amount of frequency drift compared to that of the second optical source 357 ($\delta$) and the frequency ambiguity of the optical frequency reference 370 ($\delta_{ref}$). For example, assuming the optical frequency reference provides an absolute frequency accuracy of $\delta_{ref}$, stabilizing the frequency of the second optical signal (e.g., a tunable laser source) using the $N^{th}$-order frequency tone (FIG. 3A) will result in a frequency accuracy approaching $\delta_{ref}/N$ (FIG. 3B), thus inferring an improvement in frequency-locking accuracy by a factor of N compared to the direct frequency stabilization using the given optical frequency reference.

Figure 4:
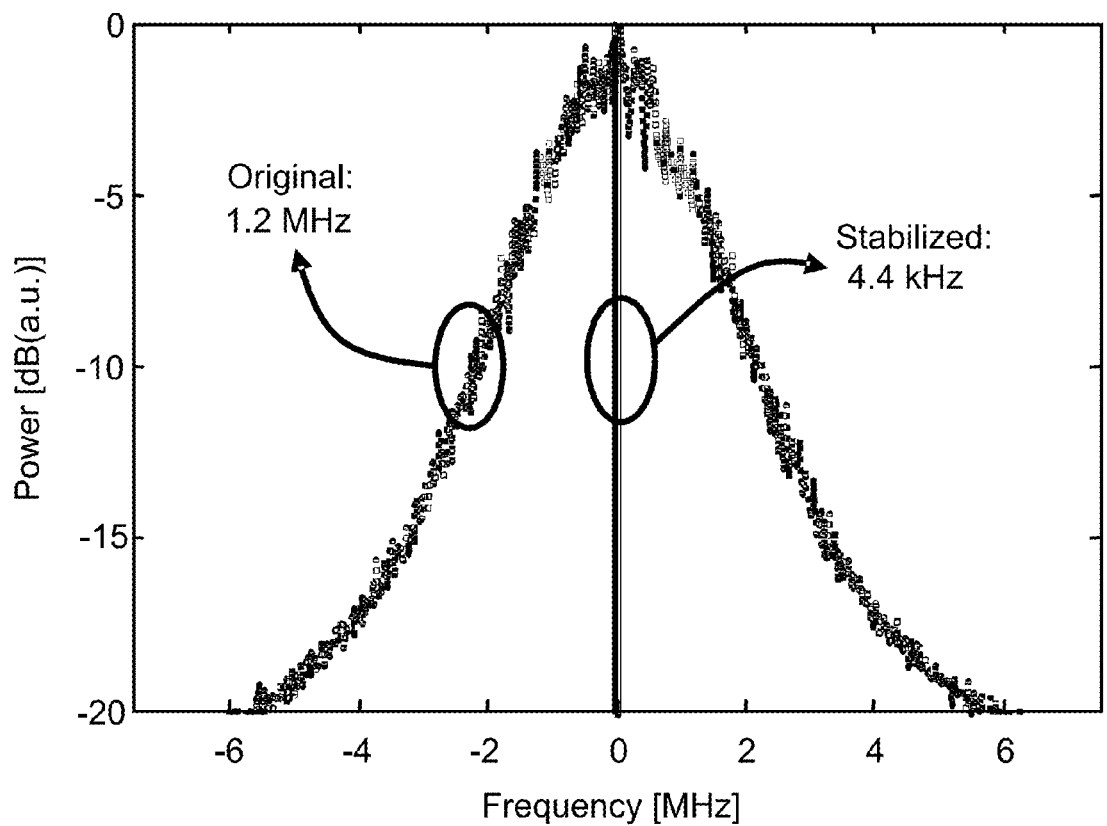
FIG. 4 shows experimental results of the spectral lineshapes of a seed laser according to various embodiments of the invention.
Figure 5:
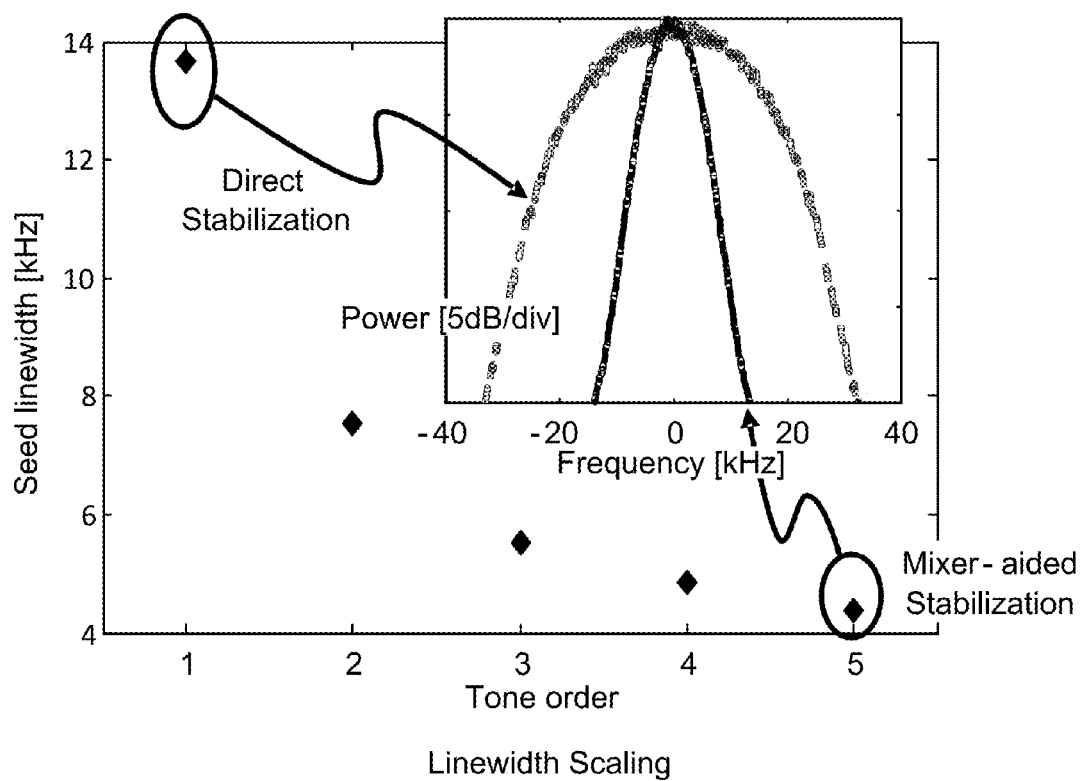
FIG. 5 shows experimental results of the spectral linewidths of a seed laser according to various embodiments of the invention; the inset shows experimental results of the spectral lineshapes of the seed laser according to various embodiments of the invention.

Benefits of the invention in a practical laser system are demonstrated in FIG. 4 and FIG. 5. FIG. 4 shows experimental results of the spectral lineshapes of a seed laser according to various embodiments of the present invention. The extent of frequency drift, described by the half-width at −3 dB of the self-heterodyne spectrum of the second optical source, was reduced from 1.2 MHz to 4.4 kHz when the disclosed system was engaged. FIG. 5 shows experimental results of the spectral linewidths of a seed laser according to various embodiments of the invention. The −3 dB half-width of the self-heterodyne spectrum of the second optical source decreased to 4.4 kHz when the $5^{th}$-order tone was selected for frequency measurement, versus 13.6 kHz when the optical source was directly stabilized against the same frequency reference. With the frequency stabilization system engaged, the half-power (−3 dB) spectral width of the second optical frequency tone ($f_1$) measured by the self-heterodyning method was reduced from 1.2 MHz to 4.4 kHz (FIG. 4). When compared to the conventional configuration, in which the optical source is directly stabilized against the optical frequency reference, the mixer-aided stabilization system described herein improves the frequency stability by more than 300%, when the $5^{th}$-order tone was used for referencing (FIG. 5). Indeed, the stability improved when a frequency tone of higher order was locked to the optical frequency reference, as depicted by the trend of decreasing spectral width in FIG. 5.

In addition to frequency stabilization, embodiments of the present invention also provide a new mechanism for a first optical signal to track the frequency motion of a second optical signal that has a different frequency from the first optical signal. Assuming the optical frequency reference can provide a perfect frequency accuracy (i.e., $\delta_{ref} = 0$), restricting the frequency of the $N^{th}$-order tone to the frequency reference will imply $N \times (\delta_1 - \delta_0) + \delta_0 = 0$. With a high-performance optical frequency mixer for which $N \gg 1$ is possible, the difference between the frequency deviation of the first and second optical signals will approach zero (with a residue equal to $\delta_0/N$), meaning that the frequency of the second optical signal tracks that of the first optical signal. Even in the presence of the reference ambiguity (i.e. $\delta_{ref} > 0$), the frequency of the second optical signal will continue to track the first optical signal's frequency drift, only with a diminished penalty given by $\delta_{ref}/N$.

The mode of frequency tracking provided by embodiments of the invention overcomes the frequency separation limit found in a conventional frequency tracking system. Conventional tracking systems require the second optical signal to generate a new tone with its frequency matching the frequency of the first optical signal. Typical means for new tone generation involve electro-optical modulation driven by an electrical signal source. The bandwidth limit in the electrical signal source, as well as in the electro-optical modulator, consequently constrains the frequency separation between the first and the second optical signal to within tens of gigahertz. In sharp contrast, the methods and systems provided by embodiments of the present invention allow at least a hundred times wider separation while maintaining tracking. The new regime of frequency tracking is likely to be found useful in multi-wavelength optical communication systems, in which the frequency of the spectrally-diverse channels should follow a pilot frequency tone in order to maintain link interoperability across the entire network. The new frequency tracking function will also be useful in sensing and ranging applications, wherein a plurality of distinct frequency tones are allowed to scan across a spectral range in perfect unison for providing new sensing/imaging modality as well as enhancing the system sensitivity.

Further to the aforementioned functionalities, the frequency stabilization system provided by embodiments of the invention entails a new mode of frequency tuning not permitted by any conventional means. In a direct frequency-locking system, tuning of the emission frequency must be accomplished through reconfiguration of the frequency reference. However, swift reconfiguration and high stability cannot be achieved simultaneously by the same frequency reference, since a stable reference must be resistive to any perturbation to its configuration, regardless to the nature of perturbation. Even though tunability needs can be addressed by incorporating multiple frequency references or a periodic spectral reference (e.g., Fabry-Perot etalon), tuning is allowed only among a sparse set of spectral positions defined by the reference. In contrast, the comb of frequency-locked optical tones created in the optical frequency mixer can release the emission frequency anchor to the spectral reference while maintaining frequency stability.

Figure 6A:
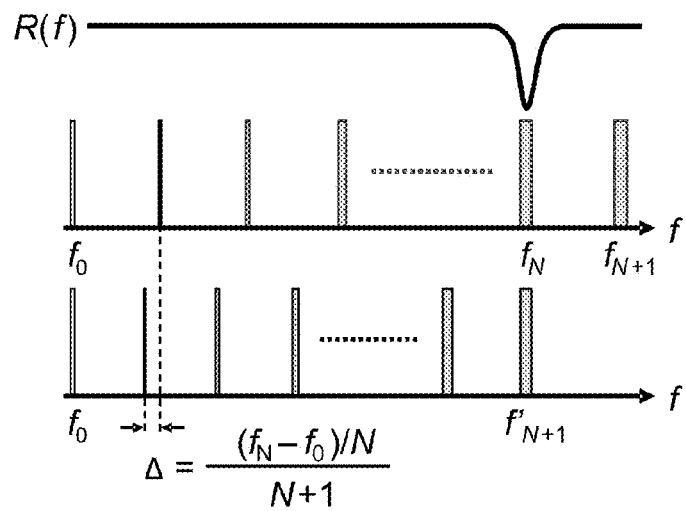
FIG. 6A illustrates tuning in frequency-stabilized laser systems enabled by extra-cavity frequency scaling process including tuning with respect to a single reference point by locking to the adjacent (N+1) tone order according to an embodiment of the present invention.

FIG. 6A illustrates tuning in frequency-stabilized laser systems enabled by extra-cavity frequency scaling process including tuning with respect to a single reference point by locking to the adjacent (N+1) tone order according to an embodiment of the present invention. With a frequency reference having a single spectral marker R(f), frequency tuning of the seed is accomplished by locking an arbitrary mixing product to the frequency reference.

Figure 6B:
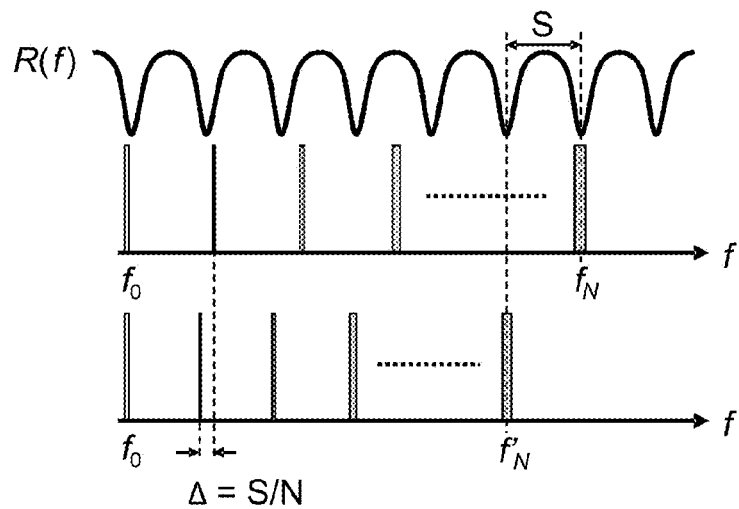
FIG. 6B illustrates tuning in frequency-stabilized laser systems enabled by extra-cavity frequency scaling process including tuning with respect to a periodic reference by locking to the adjacent spectral marker according to an embodiment of the present invention.

FIG. 6B illustrates tuning in frequency-stabilized laser systems enabled by extra-cavity frequency scaling process including tuning with respect to a periodic reference by locking to the adjacent spectral marker according to an embodiment of the present invention. In the case in which a periodic frequency reference R(f) is deployed, the invention can improve the seed tuning resolution from the frequency spacing S of reference point to S/N by locking the $N^{th}$-order tone to the reference frequency grid.

Figure 6C:
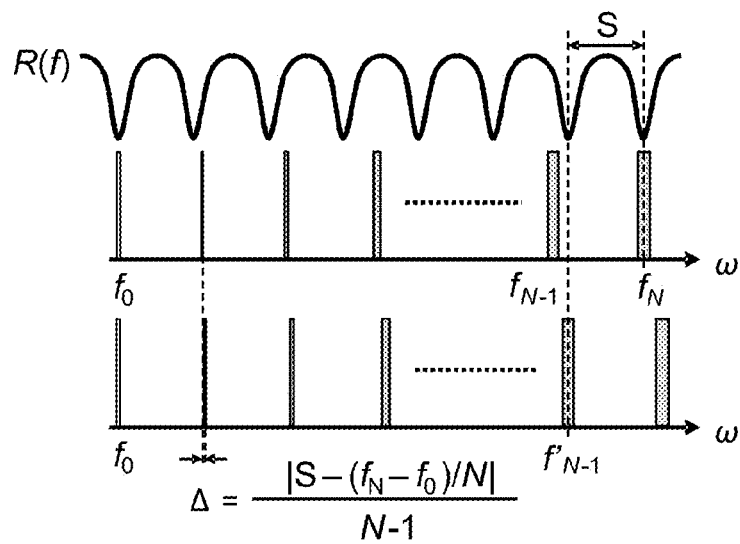
FIG. 6C illustrates tuning in frequency-stabilized laser systems enabled by extra-cavity frequency scaling process including fine frequency tuning by locking to the nearest vernier step according to an embodiment of the present invention.

FIG. 6C illustrates tuning in frequency-stabilized laser systems enabled by extra-cavity frequency scaling process including fine frequency tuning by locking to the nearest vernier step according to an embodiment of the present invention. This embodiment achieves further granularity enhancement when the frequency grids of the reference points and optical tones constitute a vernier scale (i.e. the frequency separations are co-prime), in which an adjacent tone (e.g. the $(N-1)^{th}$-order) is locked to its nearest spectral reference to complete a seed frequency jump.

The present invention is also applicable to improving the performance of an optical frequency comb generation system. Broadband optical frequency comb sources typically incorporate a nonlinear optical medium to expand the spectral span of the output optical frequency comb. While the nonlinear optical medium enables new tone generation by a cascade of nonlinear interactions between the existing frequency tones, the interaction will also transfer the frequency drift in the existing tones to the new tones, and thereby amplify the drift in the tone frequency spacing by the same mechanism transcribed by Eq. (2). The increase of frequency drifts in the newly generated, outlying frequency tones not only severs the coherence, but also decreases the optical signal-to-noise ratio of the entire frequency comb. The present invention quenches the uncontrolled coherence-fading in a nonlinearly-broadened optical frequency comb by stabilizing the outmost frequency tones to a narrow frequency reference through stabilizing the frequency separation of the input optical frequency comb. Since the frequency of all the tones are defined upon the frequency separation, the frequency stabilization will result in an improvement of tone coherence across the entire comb spectrum.

Figure 7:
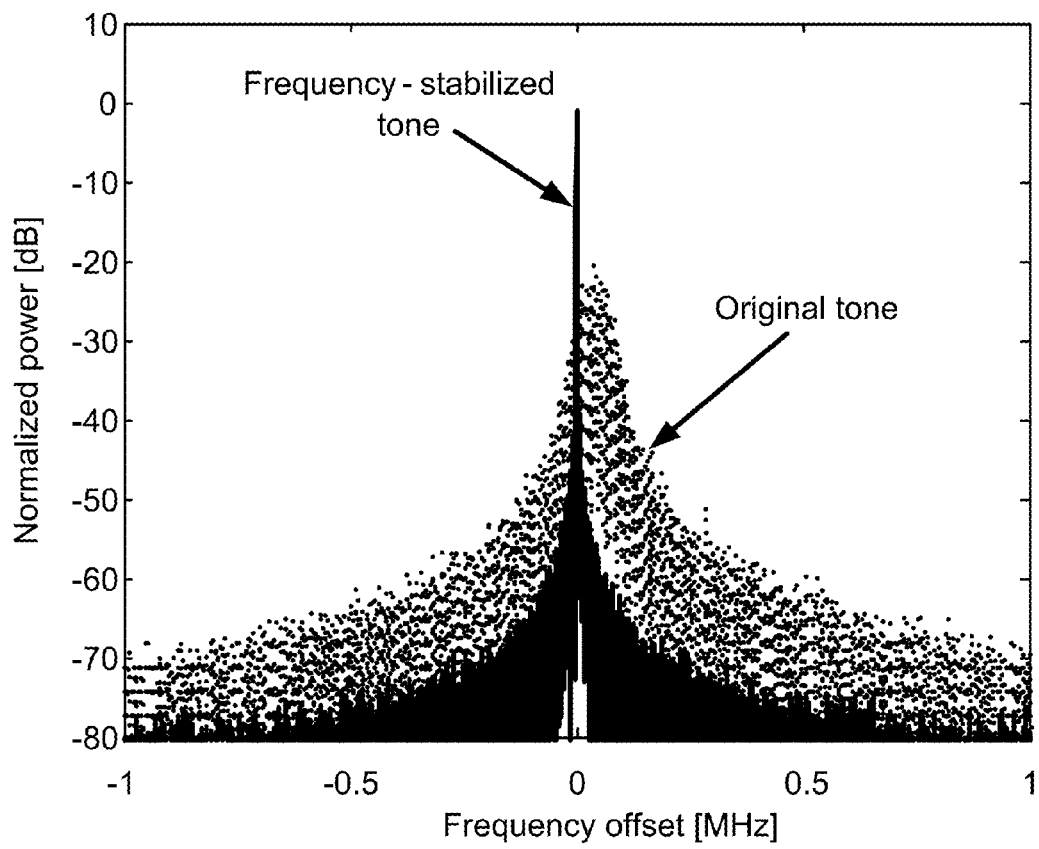
FIG. 7 shows frequency spectra of the optical frequency tones with and without frequency stabilization system engaged, according to embodiments of the invention.

FIG. 7 shows frequency spectra of the optical frequency tones with and without frequency stabilization system engaged, according to embodiments of the invention. As illustrated in FIG. 7, the spectra of an optical frequency tone in an optical frequency comb before and after frequency separation stabilization are shown. Not only is the spectral width of the frequency tone reduced, but the optical signal-to-noise ratios, as well as the generation efficiencies, are improved simultaneously, owing to the suppression of frequency-noise.

Embodiments of the present invention enable a variety of optical frequency measurement and feedback systems to stabilize the frequency of the input optical signals. The frequency stabilization system can incorporate a set of optical filters to extract a new frequency tone not present in the input optical signal. The new optical signal formed by the extracted frequency tone is subsequently received by an optical frequency reference, wherein the amount of frequency deviation relative to the target frequency of the optical frequency reference is measured. The frequency deviation measurement is performed in concert with a detection system.

Figure 8:
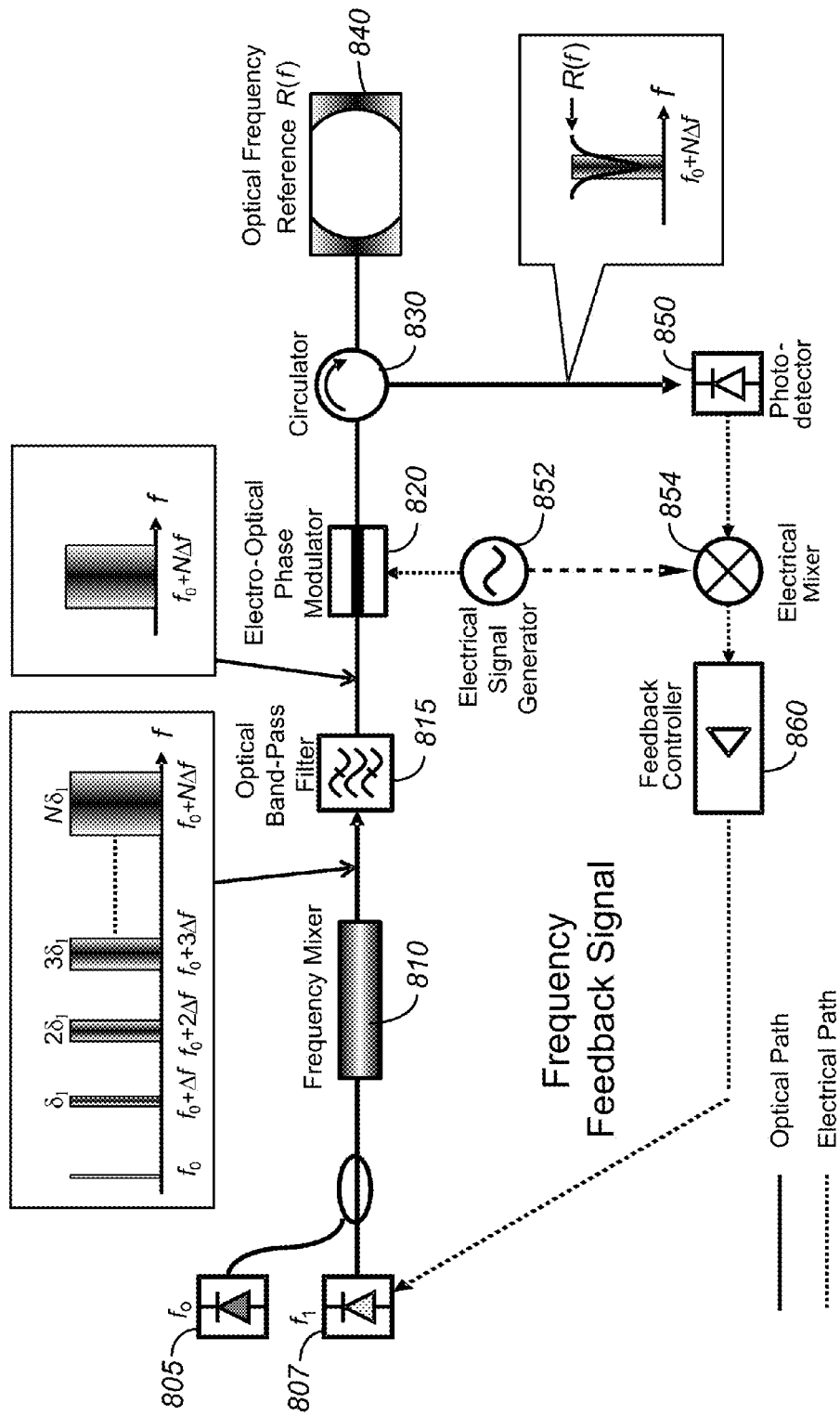
FIG. 8 is a simplified block diagram of a frequency stabilization system according to an embodiment of the invention.

FIG. 8 is a simplified block diagram of a frequency stabilization system according to an embodiment of the invention. In the example shown in FIG. 8, the detection system resembles a Pound-Drever-Hall (PDH) frequency-demodulation system, wherein an electro-optical phase modulator 820 placed at the input of the optical frequency reference 840 operates with a set of photodetector 850, optical circulator 830, electrical mixer 854 and filters 860 to derive an electrical signal (Frequency Feedback Signal). The phase modulator 820 imprints at least two additional frequency components on the extracted optical frequency tone, wherein the new components are separated from the extracted tone by the frequency of the driving electrical signal source 852, denoted as $\Omega$ hereinafter. The drift of frequency from the center of the spectral feature of the optical frequency reference 840 will result in a corresponding change in the phase of the photo-current generated by the photodetector 850 at the frequency $\Omega$. The electrical mixer 854 demodulates the phase at frequency $\Omega$ carried by the photo-current, resulting in an electrical signal approximately proportional to the frequency drift of the extracted optical tone relative to the optical frequency reference.

The system includes an input optical signal source operable to generate a first optical wave and a second optical wave characterized by a first center frequency and a second center frequency, respectively, the first center frequency and the second center frequency being separated by a frequency spacing. As illustrated in FIG. 8, the input optical signal source includes a first laser source 805 and a second laser source 807 operable to generate the first optical wave (frequency $f_0$) and the second optical wave (frequency $f_1$), respectively. The first laser source and the second laser source are independent from each other in this embodiment. In an embodiment, the input signal source includes a passive mode-locked laser or an active mode-locked laser.

In one implementation, the spectral linewidth of the first optical wave is not greater than about 20 megahertz. In these embodiments, the spectral linewidth of the first optical wave is defined by the full-width at half-maximum of a spectral line in the self-heterodyne spectrum with a 1-microsecond delay.

The system also includes an optical frequency mixer 810 coupled to the input optical signal source and operable to input the first optical wave and the second optical wave to generate a plurality of third optical waves characterized by respective third center frequencies separated from each other by the frequency spacing. At least one third center frequency is different from the first center frequency and the second center frequency. As an example, the optical frequency mixer can include a nonlinear optical medium such as an optical fiber, fiber optic waveguides, lithium niobate waveguides, or silicon waveguides, chalcogenide waveguides, or the like. At least one segment of the nonlinear optical medium can be characterized by a third-order nonlinear optical response. Alternatively, the nonlinear optical medium can have at least one segment characterized by a second-order nonlinear optical response.

The system further includes a spectral filter (i.e., optical band pass filter 815) coupled to the optical frequency mixer 810 and operable to transmit one of the plurality of third optical waves. In the illustrated embodiment, the third optical wave is at frequency $f_0+N\Delta f$. The transmitted third optical wave is characterized by a selected third center frequency that is different from the first center frequency and the second center frequency.

Moreover, the system includes an optical frequency reference 840 coupled to the spectral filter (i.e., the optical band pass filter) and operable to generate an output optical signal characterized by an amplitude that is proportional to a frequency difference between a reference frequency and the selected third center frequency. The optical frequency reference can be provided in one of several forms, including an optical cavity resonator, a diffraction-based device including at least one optical diffraction grating, or the like. As an example, the at least one optical diffraction grating can be embedded in an optical fiber or provided as a discreet component. In some implementations, the reference frequency is a characteristic frequency of an absorption or transmission response of a chemical species, for example, acetylene, cesium, hydrogen cyanide, or the like. In a particular embodiment, the absorption or transmission response of the chemical species is characterized by a bandwidth of less than about 10 GHz.

A photodetector 850 is coupled to the optical frequency reference 840 and operable to convert the output optical signal to an electrical signal. A feedback controller 860 is coupled to the photodetector and the input optical signal source. As illustrated in FIG. 8, the feedback controller 860 is operable to convert the electrical signal into a frequency-tuning signal and to apply the frequency-tuning signal to the input optical signal source. The frequency feedback signal is applied to the second optical source 807 in FIG. 8 to adjust the second center frequency and thereby stabilizing the second center frequency.

The feedback controller can take several forms including use of a proportional gain path, a derivative gain path, an integral gain path, or a combination thereof. In a particular embodiment, the feedback controller includes a gain path characterized by a temporal response that is matched to a spectral linewidth broadening mechanism of the input optical signal source. As an example, a proportional integral derivative (PID) controller or other suitable controllers.

Figure 11A:
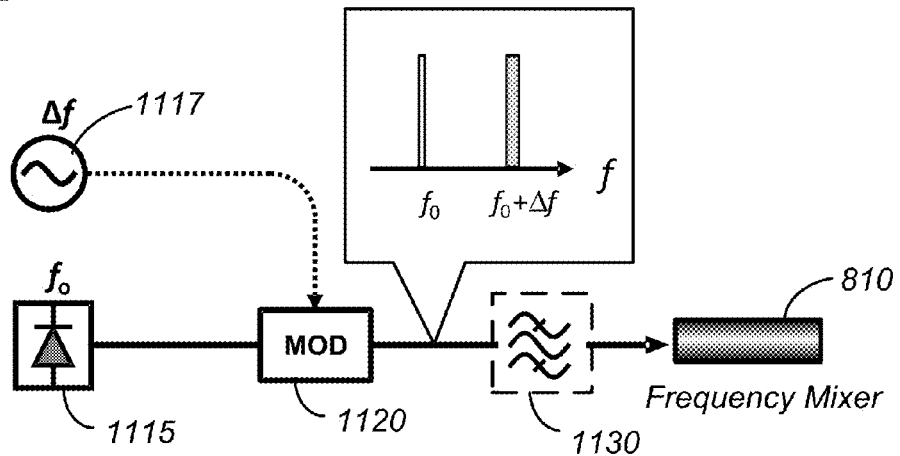
FIGS. 11A and 11B illustrate alternative optical sources according to embodiments of the present invention.
Figure 11B:
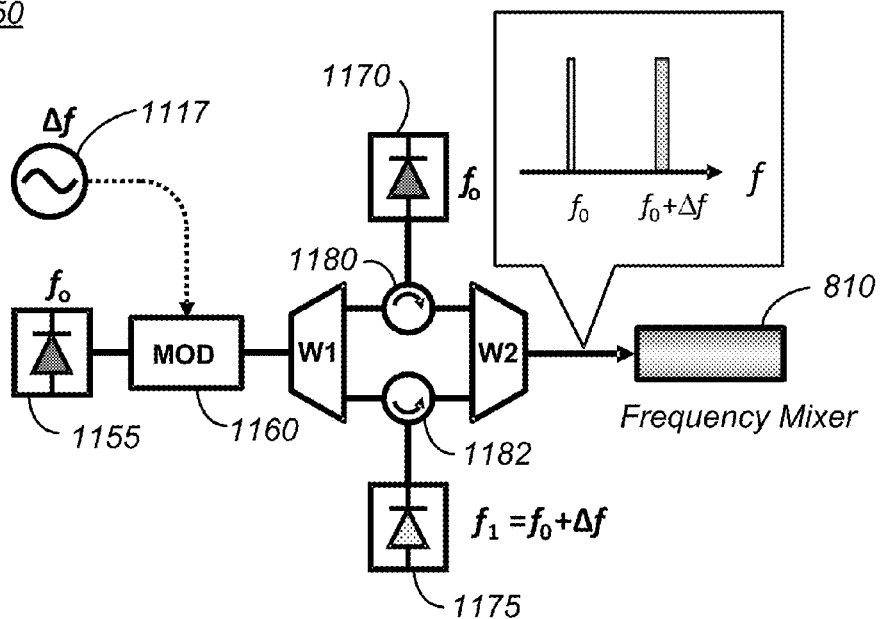

Although the input optical signal source illustrated in FIG. 8 includes first laser source 805 and second laser source 807 operable to generate the first optical wave (frequency $f_0$) and the second optical wave (frequency $f_1$), respectively, the invention is not limited to this particular input optical source. FIGS. 11A and 11B illustrate alternative optical sources that can be used in place of or in addition to lasers 805 and 807 in the input optical source.

Referring to FIG. 11A, input optical source 1110 includes a seed laser source 1115 operable to generate a seed optical wave characterized by a seed center frequency and an optical modulator 1120 driven by signal source 1117 and operable to transform the seed optical wave into the first optical wave and the second optical wave, illustrated at frequency $f_0$ and frequency $f_0+\Delta f$, respectively. As an example, optical modulator 1120 can be an electro-optical modulator, for example, either an amplitude modulator or a phase modulator.

Referring to FIG. 11B, in another alternative embodiment, the input signal source 1150 includes a seed laser source 1155 operable to generate a seed optical wave characterized by a seed center frequency. The input optical source 1150 also includes an optical modulator 1160 coupled to the seed laser source and operable to transform the seed optical wave into a first intermediate optical wave and the second intermediate optical wave characterized by the first center frequency and the second center frequency, respectively. Additionally, the input optical source 1150 includes a first slave source 1170 and a second slave source 1175 coupled to the optical modulator 1160 and operable to emit the first optical wave and the second optical wave, respectively. Injection locking using the first intermediate optical wave and the second intermediate optical wave, respectively is performed in conjunction with optical splitter S1 and optical coupler W2 as well as optical circulators 1180 and 1182.

Referring once again to FIG. 11A, in some embodiments, the input optical signal source includes not only a seed laser source 1115 operable to generate a seed optical wave characterized by a seed center frequency and an optical modulator 1120 coupled to the seed laser source and operable to transform the seed optical wave into a plurality of input optical waves including the first optical wave and the second optical wave, but also includes a spectral filter 1130 coupled to the optical modulator 1120 and operable to transmit the first optical wave and the second optical wave to the optical frequency mixer 810.

Figure 9:
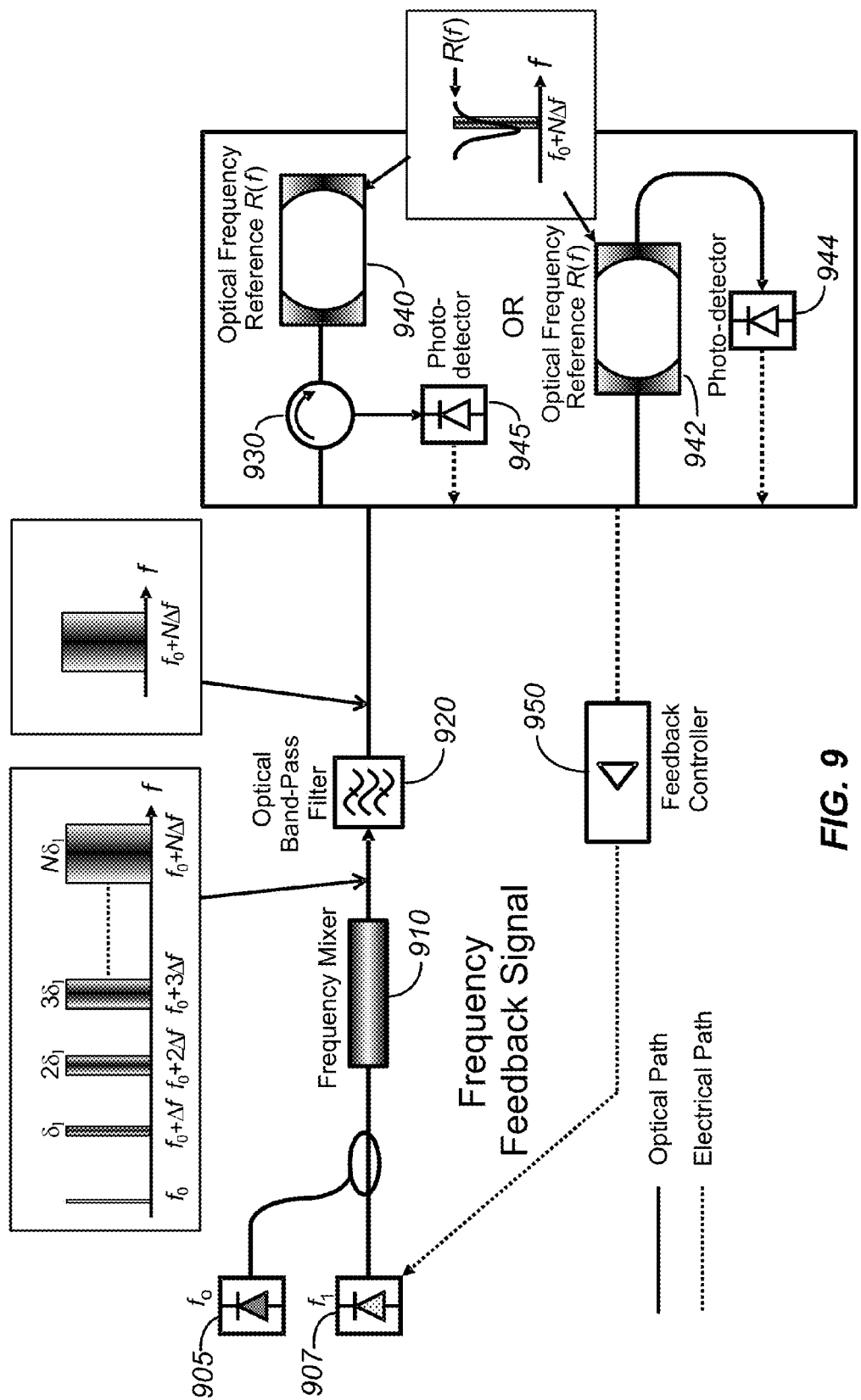
FIG. 9 is a simplified schematic diagram of a frequency stabilization system according to another embodiment of the invention.

FIG. 9 is a simplified schematic diagram of a frequency stabilization system according to another embodiment of the invention. In the example shown in FIG. 9, the detection system comprises a photodetector 945/944 that is configured to receive either the transmitted optical signal or the reflected optical signal (through an optical circulator) from the optical frequency reference 940/942. The extracted optical frequency tone is set to align its mean frequency to one of the edges of the spectral feature conveyed by the optical frequency reference. The frequency drift of the extracted optical signal is consequently converted to the power of the transmitted (or reflected) optical signal from the optical frequency reference. Photodetection of the transmitted (or reflected) optical signal thus results in an electrical signal proportional to the frequency offset relative to the mean frequency. Regardless to the implementation of the frequency detection system, the electrical signal derived from the detection system in the optical frequency reference conveys the information regarding to the instantaneous deviation of the frequency separation in the input optical frequency comb. The electrical signal is subsequently received by a feedback controller, wherein a corresponding frequency correction signal is derived. While various implementations of the feedback controller exist, the basic form of the controller comprises a combination of functional blocks providing gain directly to the input electrical signal (denoted as proportional gain), to the time-integral of the input signal (integral gain), or to the time-derivative of the input signal (derivative gain). The feedback controller combines the contribution of all the gain blocks, and may add in any addition external signals as appropriate, to form a frequency correction signal. The frequency correction signal is then received by at least one of the input optical signal source, or the electrical signal source responsible for defining the comb frequency separation, in order to correct the frequency drift detected by the frequency stabilization system.

Figure 10:
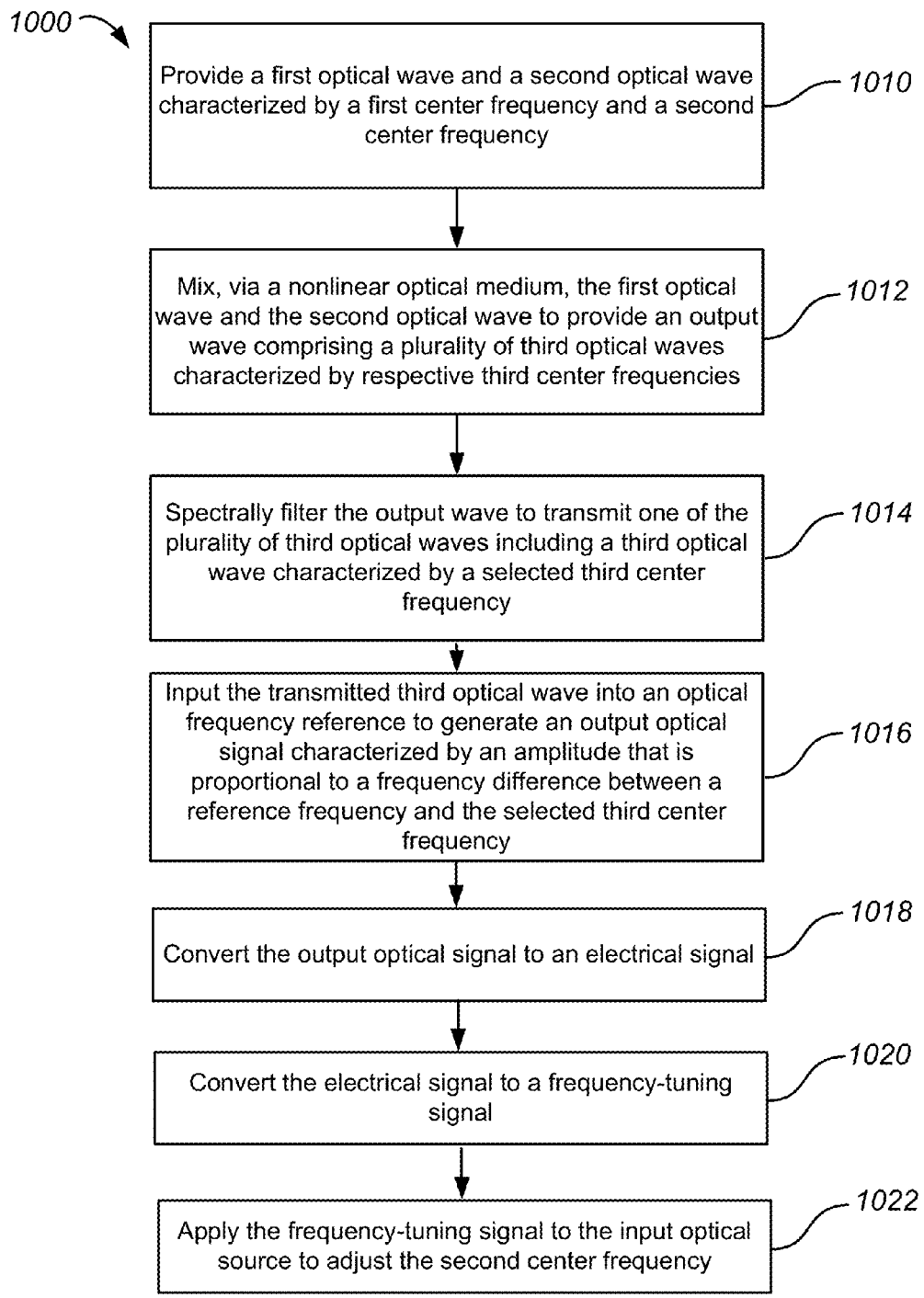
FIG. 10 is a simplified flowchart illustrating a method of frequency stabilizing an optical source according to an embodiment of the present invention.

FIG. 10 is a simplified flowchart illustrating a method of frequency stabilizing an optical source according to an embodiment of the present invention. The method 1000 includes providing, using an input optical signal source, a first optical wave and a second optical wave characterized by a first center frequency and a second center frequency, respectively (1010). The first center frequency and the second center frequency are separated by a frequency spacing.

In an embodiment, providing the first optical wave and the second optical wave includes providing a seed optical signal and modulating the seed optical signal to provide the first optical wave and the second optical wave. In another embodiment, providing the first optical wave and a second optical wave includes providing a seed optical signal, modulating the seed optical signal to provide the first intermediate optical wave and the second intermediate optical wave characterized by the first center frequency and the second center frequency, respectively, and injection locking a first slave laser and a second laser, using the first intermediate optical wave and the second intermediate optical wave, respectively, to generate the first optical wave and the second optical wave. In yet another embodiment, providing the first optical wave and the second optical wave includes providing a seed optical signal, modulating the seed optical signal to provide a plurality of input optical waves including the first optical wave and the second optical wave, and spectrally filtering the plurality of input optical waves to transmit the first optical wave and the second optical wave.

The method also includes mixing, via a nonlinear optical medium, the first optical wave and the second optical wave to provide an output wave comprising a plurality of third optical waves characterized by respective third center frequencies separated from each other by the frequency spacing (1012). At least one third center frequency is different from the first center frequency and the second center frequency.

The method further includes spectrally filtering the output wave to transmit one of the plurality of third optical waves (1014). The transmitted third optical wave is characterized by a selected third center frequency that is different from the first center frequency and the second center frequency. Additionally, the method includes inputting the transmitted third optical wave into an optical frequency reference to generate an output optical signal characterized by an amplitude that is proportional to a frequency difference between a reference frequency and the selected third center frequency (1016).

The method also includes converting the output optical signal to an electrical signal (1018), converting the electrical signal to a frequency-tuning signal (1020), and applying the frequency-tuning signal to the input optical signal source to adjust the second center frequency, thereby stabilizing the second center frequency (1022).

It should be appreciated that the specific steps illustrated in FIG. 10 provide a particular method of providing a frequency stabilized signal according to an embodiment of the present invention. Other sequences of steps may also be performed according to alternative embodiments. For example, alternative embodiments of the present invention may perform the steps outlined above in a different order. Moreover, the individual steps illustrated in FIG. 10 may include multiple substeps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A system comprising:
an input optical signal source operable to generate a first optical wave and a second optical wave characterized by a first center frequency and a second center frequency, respectively, the first center frequency and the second center frequency being separated by a frequency spacing;
an optical frequency mixer coupled to the input optical signal source and operable to input the first optical wave and the second optical wave to generate a plurality of third optical waves characterized by respective third center frequencies separated from each other by the frequency spacing, and wherein at least one third center frequency is different from the first center frequency and the second center frequency;
a spectral filter coupled to the optical frequency mixer and operable to transmit one of the plurality of third optical waves, the transmitted third optical wave being characterized by a selected third center frequency that is different from the first center frequency and the second center frequency;
an optical frequency reference coupled to the spectral filter and operable to generate an output optical signal characterized by an amplitude that is proportional to a frequency difference between a reference frequency and the selected third center frequency;
a photodetector coupled to the optical frequency reference and operable to convert the output optical signal to an electrical signal; and
a feedback controller coupled to the photodetector and the input optical signal source, wherein the feedback controller is operable to convert the electrical signal into a frequency-tuning signal and to apply the frequency-tuning signal to the input optical signal source to adjust the second center frequency thereby stabilizing the second center frequency.

2. The system of claim 1 wherein the input optical signal source comprises a first laser source and a second laser operable to generate the first optical wave and the second optical wave, respectively, wherein the first laser source and the second laser source are independent from each other.

3. The system of claim 1 wherein the input optical signal source comprises:
a seed laser source operable to generate a seed optical wave characterized by a seed center frequency; and
an optical modulator operable to transform the seed optical wave into the first optical wave and the second optical wave.

4. The system of claim 3 wherein the optical modulator comprises an electro-optical modulator.

5. The system of claim 4 wherein the optical modulator comprises an amplitude modulator or a phase modulator.

6. The system of claim 1 wherein the input signal source comprises:
a seed laser source operable to generate a seed optical wave characterized by a seed center frequency;
an optical modulator coupled to the seed laser source and operable to transform the seed optical wave into a first intermediate optical wave and the second intermediate optical wave characterized by the first center frequency and the second center frequency, respectively; and a first slave source and a second slave source coupled to the optical modulator and operable to emit the first optical wave and the second optical wave, respectively, injection locking using the first intermediate optical wave and the second intermediate optical wave, respectively.

7. The system of claim 1 wherein the input optical signal source comprises:

a seed laser source operable to generate a seed optical wave characterized by a seed center frequency;

an optical modulator coupled to the seed laser source and operable to transform the seed optical wave into a plurality of input optical waves including the first optical wave and the second optical wave; and a spectral filter coupled to the optical modulator and operable to transmit the first optical wave and the second optical wave to the optical frequency mixer.

8. The system of claim 1 wherein the input signal source comprises a passive mode-locked laser.

9. The system of claim 1 wherein the input signal source comprises an active mode-locked laser.

10. The system of claim 1 wherein the optical frequency mixer comprises a nonlinear optical medium comprising at least one segment characterized by a third-order nonlinear optical response.

11. The system of claim 1 wherein the optical frequency mixer comprises a nonlinear optical medium comprising at least one segment characterized by a second-order nonlinear optical response.

12. The system of claim 1 wherein the optical frequency reference comprises an optical cavity resonator.

13. The system of claim 1 wherein the optical frequency reference comprises at least one optical diffraction grating.

14. The system of claim 13 wherein the at least one optical diffraction grating is embedded in an optical fiber.

15. The system of claim 1 wherein the reference frequency is a characteristic frequency of an absorption or transmission response of a chemical species.

16. The system of claim 15 wherein the absorption or transmission response of the chemical species is characterized by a bandwidth of less than about 10 Gigahertz.

17. The system of claim 1 wherein the spectral linewidth of the first optical wave is not greater than about 20 megahertz.

18. The system of claim 17 wherein the spectral linewidth of the first optical wave is defined by the full-width at half-maximum of a spectral line in the self-heterodyne spectrum with a 1-microsecond delay.

19. The system of claim 1 wherein the feedback controller comprises one of a proportional gain path, a derivative gain path, an integral gain path, or a combination thereof.

20. The system of claim 1 wherein the feedback controller comprises a gain path characterized by a temporal response that is matched to a spectral linewidth broadening mechanism of the input optical signal source.

21. A method comprising:

providing, using an input optical signal source, a first optical wave and a second optical wave characterized by a first center frequency and a second center frequency, respectively, wherein the first center frequency and the second center frequency are separated by a frequency spacing;

mixing, via a nonlinear optical medium, the first optical wave and the second optical wave to provide an output wave comprising a plurality of third optical waves characterized by respective third center frequencies separated from each other by the frequency spacing, wherein at least one third center frequency is different from the first center frequency and the second center frequency;

spectrally filtering the output wave to transmit one of the plurality of third optical waves, the transmitted third optical wave being characterized by a selected third center frequency that is different from the first center frequency and the second center frequency;

inputting the transmitted third optical wave into an optical frequency reference to generate an output optical signal characterized by an amplitude that is proportional to a frequency difference between a reference frequency and the selected third center frequency;

converting the output optical signal to an electrical signal;

converting the electrical signal to a frequency-tuning signal; and applying the frequency-tuning signal to the input optical signal source to adjust the second center frequency, thereby stabilizing the second center frequency.

22. The method of claim 21 wherein providing the first optical wave and the second optical wave comprises:

providing a seed optical signal; and modulating the seed optical signal to provide the first optical wave and the second optical wave.

23. The method claim 21 wherein providing the first optical wave and a second optical wave comprises:

providing a seed optical signal;

modulating the seed optical signal to provide the first intermediate optical wave and the second intermediate optical wave characterized by the first center frequency and the second center frequency, respectively; and injection locking a first slave laser and a second laser, using the first intermediate optical wave and the second intermediate optical wave, respectively, to generate the first optical wave and the second optical wave.

24. The method of claim 21 wherein providing the first optical wave and the second optical wave comprises:

providing a seed optical signal;

modulating the seed optical signal to provide a plurality of input optical waves including the first optical wave and the second optical wave; and spectrally filtering the plurality of input optical waves to transmit the first optical wave and the second optical wave.

* * * * *